US012738918B2

(12) United States Patent
Kassteen

(10) Patent No.: US 12,738,918 B2
(45) Date of Patent: Sep. 15, 2026

(54) DIE PACKAGE WITH SEALED DIE ENCLOSURES

(71) Applicant: QUALCOMM Incorporated, San Diego, CA (US)

(72) Inventor: Bart Kassteen, Helden (NL)

(73) Assignee: QUALCOMM Incorporated, San Diego, CA (US)

( * ) Notice: Subject to any disclaimer, the term of this patent is extended or adjusted under 35 U.S.C. 154(b) by 865 days.

(21) Appl. No.: 17/932,209

(22) Filed: Sep. 14, 2022

(65) Prior Publication Data

US 2024/0088081 A1 Mar. 14, 2024

(51) Int. Cl.

| | |
|---|---|
| ***H01L 23/00*** | (2006.01) |
| ***H03H 3/08*** | (2006.01) |
| ***H03H 9/02*** | (2006.01) |
| ***H03H 9/05*** | (2006.01) |
| ***H10W 40/00*** | (2026.01) |
| ***H10W 40/22*** | (2026.01) |
| ***H10W 42/20*** | (2026.01) |
| ***H10W 70/68*** | (2026.01) |
| ***H10W 70/685*** | (2026.01) |
| ***H10W 90/00*** | (2026.01) |
| *H10W 72/20* | (2026.01) |
| *H10W 74/00* | (2026.01) |
| *H10W 74/10* | (2026.01) |
| *H10W 74/40* | (2026.01) |

(52) U.S. Cl.

CPC .......... *H03H 9/02102* (2013.01); *H03H 3/08* (2013.01); *H03H 9/02834* (2013.01); *H03H 9/02913* (2013.01); *H03H 9/02976* (2013.01); *H03H 9/0542* (2013.01); *H10W 40/037* (2026.01); *H10W 40/228* (2026.01); *H10W 42/20* (2026.01); *H10W 70/68* (2026.01); *H10W 70/685* (2026.01); *H10W 90/00* (2026.01); *H10W 72/287* (2026.01); *H10W 74/00* (2026.01); *H10W 74/127* (2026.01); *H10W 74/40* (2026.01); *H10W 90/724* (2026.01)

(58) Field of Classification Search

None

See application file for complete search history.

(56) References Cited

U.S. PATENT DOCUMENTS

| | | | | |
|---|---|---|---|---|
| 5,459,368 | A * | 10/1995 | Onishi | H03H 9/059<br>310/313 R |
| 7,154,206 | B2 * | 12/2006 | Shimada | H03H 3/08<br>257/E23.128 |
| 7,474,175 | B2 * | 1/2009 | Furihata | H03H 9/1085<br>257/E23.125 |
| 11,456,721 | B2 * | 9/2022 | Eid | H03H 9/1014 |

(Continued)

OTHER PUBLICATIONS

International Search Report and Written Opinion—PCT/US2023/073500—ISA/EPO—Jan. 3, 2024.

*Primary Examiner* — Long Pham

(74) *Attorney, Agent, or Firm* — Muncy, Geissler, Olds & Lowe, P.C.

(57) ABSTRACT

Disclosed are apparatuses and techniques for fabricating single or multi-die packages with sealed enclosures. In one or more aspects an apparatus includes a die; a perimeter metallization disposed on a perimeter of the die; a package substrate; and a seal coupled to the perimeter metallization and the package substrate, configured to seal the die to the package substrate.

40 Claims, 14 Drawing Sheets

(56) References Cited

U.S. PATENT DOCUMENTS

| | | | | |
|---|---|---|---|---|
| 2002/0149298 | A1 | 10/2002 | Furukawa et al. | |
| 2008/0272858 | A1* | 11/2008 | Furihata | H03H 9/02984 257/E23.125 |
| 2016/0126443 | A1* | 5/2016 | Barfknecht | H03H 9/1071 361/757 |
| 2020/0219861 | A1* | 7/2020 | Kamgaing | H03H 9/0561 |
| 2020/0234716 | A1* | 7/2020 | Naravanekar | G06F 3/167 |
| 2020/0287520 | A1* | 9/2020 | Kamgaing | H03H 9/1014 |
| 2020/0382101 | A1* | 12/2020 | Turner | H03H 9/105 |
| 2021/0375707 | A1* | 12/2021 | Teixeira De Queiros | H01L 25/0655 |

* cited by examiner

DIE PACKAGE WITH SEALED DIE ENCLOSURES

BACKGROUND OF THE DISCLOSURE

1. Field of the Disclosure

Aspects of the disclosure relate generally to single or multi-die packages and in particular to multi-die packages sealed on the die perimeter to provide an air chamber for dies with acoustic filters.

2. Description of the Related Art

Integrated circuit technology has achieved great strides in advancing computing power through miniaturization of active components. The various packaging technologies such can be found in many electronic devices, including processors, servers, radio frequency (RF) integrated circuits, etc. Advanced packaging and processing techniques allow for complex devices, such as multi-die devices and system on a chip (SOC) devices, which. may include multiple function blocks, with each function block designed to perform a specific function, such as, for example, a microprocessor function, a graphics processing unit (GPU) function, a communications function (e.g., Wi-Fi, Bluetooth, and other communications), and the like.

Multi-die/multi-chip package cost reduction is a goal in the industry to be competitive in the market. In the last few years, there has been a trend of moving away from expensive wafer level chip packages (e.g., Thin Film Acoustic Package (TFAP) or a Die-Sized SAW (surface acoustic wave) Package (DSSP), etc.) and utilizing new packaging techniques, such as, bare die glob-top encapsulation.

However, glob-top encapsulation has several disadvantages, such as solder fatigue and controlling the glob-top bleeding. The solder fatigue issues negatively impact the reliability of the device due to the lack of molded underfill. Controlling the glob-top bleeding process is challenging in conventional processing for close die-to-die placement (e.g., 180 micron (um) space between dies). A large positive or negative glob-top undercut can lead to reliability issues (e.g., early failures due to solder fatigue). Further, the lack of mold underfill and poor thermal conductivity of glob-top lamination materials negatively impacts the thermal resistance of bare die packages (e.g., junction thermal resistances Rjb and Rjc), Accordingly, there is a need for systems, apparatuses and methods that overcome the deficiencies of conventional designs including the methods, systems, and apparatuses for single and multi-die packages with sealed enclosures provided herein in the following disclosure.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

One or more aspects include an apparatus comprising: a die; a perimeter metallization disposed on a perimeter of the die; a package substrate; and a seal coupled to the perimeter metallization and the package substrate, configured to seal the die to the package substrate.

One or more aspects include a method for fabricating an apparatus. The method comprising: forming a die; forming a perimeter metallization on a perimeter of the die; forming a package substrate; and coupling a seal to the perimeter metallization and the package substrate, to seal the die to the package substrate.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage, or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

In certain described example implementations, instances are identified where various component structures and portions of operations can be taken from known, conventional techniques, and then arranged in accordance with one or more exemplary aspects. In such instances, internal details of the known, conventional component structures and/or portions of operations may be omitted to help avoid potential obfuscation of the concepts illustrated in the illustrative aspects disclosed herein.

The terminology used herein is for the purpose of describing particular aspects only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 1A:
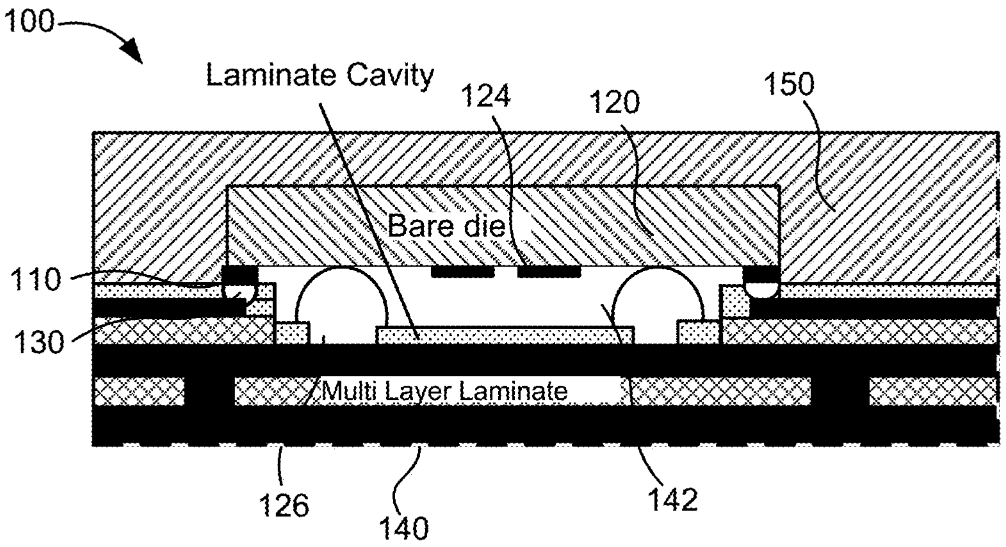
FIG. 1A illustrates a partial cross-sectional view of an apparatus in accordance with one or more aspects of the disclosure.

FIG. 1A illustrates a partial cross-sectional view of an apparatus 100 in accordance with one or more aspects of the disclosure. The apparatus 100 includes a die 120, which may be a bare die. A perimeter metallization 110 is disposed on a perimeter of the die 120. A package substrate 140, which can be a multi-layer laminate substrate, is disposed below the die 120. A seal 130 is coupled to the perimeter metallization 110 and the package substrate 140. The seal 130 is configured to seal the die 120 to the package substrate 140. In some aspects the seal 130 may have conductive properties, e.g., solder, silver sintering paste, and the like. In other aspects, the seal 130 may be a polymer. The apparatus 100 may have single or multi-die package configuration. In some aspects, more than one die may be included and the multi-die package may include solder sealed enclosures (i.e., the seal 130 may be solder balls, solder paste, etc.). The package substrate 140 may include a cavity 142 (which may be an air cavity) around resonators 124 (e.g., acoustic resonators). The cavity 142 may be disposed between the die 120 and package substrate 140. The cavity 142 in some aspects has a smaller perimeter than the die 120. The cavity 142 is provided in the package substrate 140, which allows for package height reduction and stiffer connection between die 120 and package substrate 140. In some aspects, the die 120 is disposed on an open side of the cavity 142 and the seal 130 is configured to seal the cavity 142. The plurality of resonators 124 is disposed on a surface of the die 120 that is sealed along with the cavity by seal 130 and allows for an air filled cavity 142 for the plurality of resonators 124. The die 120 may be electrically coupled to package substrate 140 by connectors 126, which may be solder balls, solder bumps, copper pillars, pins, or any suitable connector. In some aspects, the perimeter metallization 110 is disposed on a bottom of the die 120 facing the package substrate 140. In some aspects, the seal 130 is coupled at least partially to a topside of package substrate 140 facing the die 120. In some aspects, a package encapsulant 150 (e.g., mold/Glob-top) is disposed over the die 120 and package substrate 140. This configuration may provide various improvements, such as, cost reduction (no wafer level packaging), ultra-low reliability requirements for the package encapsulant 150 (e.g., mold/Glob-top), eliminate unreliable globtop bleeding/underfill issues, improve solder fatigue reliability (more solder connections with larger surface area), significantly improved thermal resistance (more solder connections with larger surface area) and other benefits discussed herein.

Figure 1B:
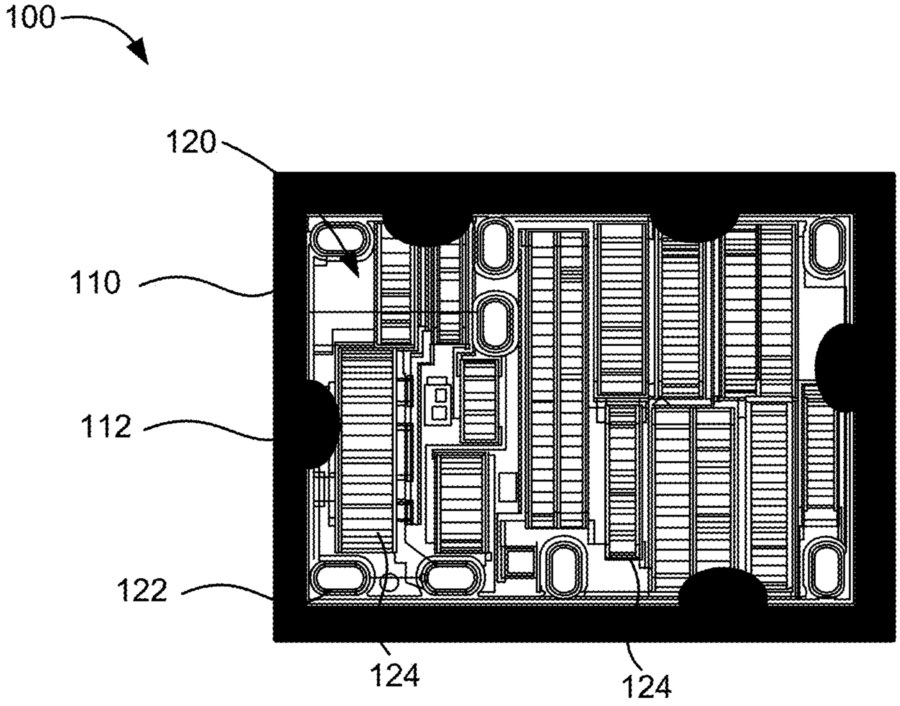
FIG. 1B illustrates a partial bottom plan view of an apparatus in accordance with one or more aspects of the disclosure.

FIG. 1B a partial bottom plan view of an apparatus 100 in accordance with one or more aspects of the disclosure. In one or more aspects, larger perimeter pads 112 are added on the perimeter metallization 110 (e.g., copper metallization) The perimeter metallization 110 and conductive allows for independent control of the resulting perimeter solder height and bump height, by controlling amount of solder balls/solder volume on the perimeter metallization 110. The plurality of resonators 124 can be coupled to external circuits through connector pads 122 (under-bump metallization (UBM)) that can be used to couple to connectors (e.g., solder balls) 126 illustrated in FIG. 1A. The connector pads 122 can be used for coupling signal connections of the die 120. The perimeter pads 112 can be used to couple the perimeter metallization 110 to ground and provide additional mechanical support.

Figure 2:
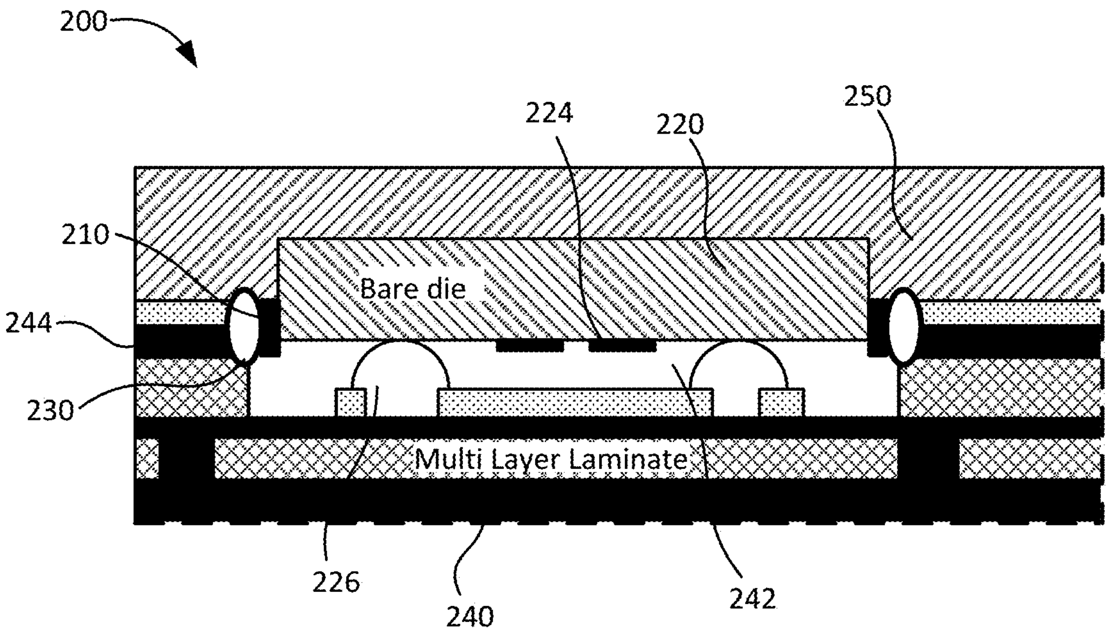
FIG. 2 illustrates a partial cross-sectional view of an apparatus in accordance with one or more aspects of the disclosure.

FIG. 2 illustrates a partial cross-sectional view of an apparatus 200 in accordance with one or more aspects of the disclosure. The apparatus 200 includes a die 220, which may be a bare die. A perimeter metallization 210 is disposed on a perimeter of the die 220. A package substrate 240, which can be a multi-layer laminate substrate, is disposed below the die 220. A seal 230 is coupled to the perimeter metallization 210 and the package substrate 240. The seal 230 is configured to seal the die 220 to the package substrate 240. The apparatus 200 may have a single or multi-die package configuration. The package substrate 240 may include a cavity 242 (e.g., air cavity) around resonators 224 (e.g., acoustic resonators). The cavity 242 may be disposed between the die 220 and package substrate 240. The cavity 242 in some aspects has a larger perimeter than the die 220. The cavity 242 is provided in the package substrate 240, which allows for package height reduction and stiffer connection between die 220 and package substrate 240. The plurality of resonators 224 is disposed on a surface of the die 220 that is sealed along with the cavity by seal 230 and allows for an air filled cavity 242 for the plurality of resonators 224. The die 220 may be electrically coupled to package substrate 240 by connectors 226. In some aspects, a package encapsulant 250 (e.g., mold/Glob-top) is disposed over the die 220 and package substrate 240. In some aspects, the die 220 is at least partially embedded in the cavity 242. In one or more aspects, the perimeter metallization 210 is disposed at least partially on a side of the die 220, as illustrated. In some aspects, the seal 230 is coupled at least partially to a sidewall of the cavity 242, and may be coupled to one or more metal layers 244 in the multi-layer package substrate 240. This configuration can provide for a reduction in package height, stiffer connection between die and package substrate, improved fatigue life for the solder bumps/connections. and other benefits discussed herein.

Figure 3:
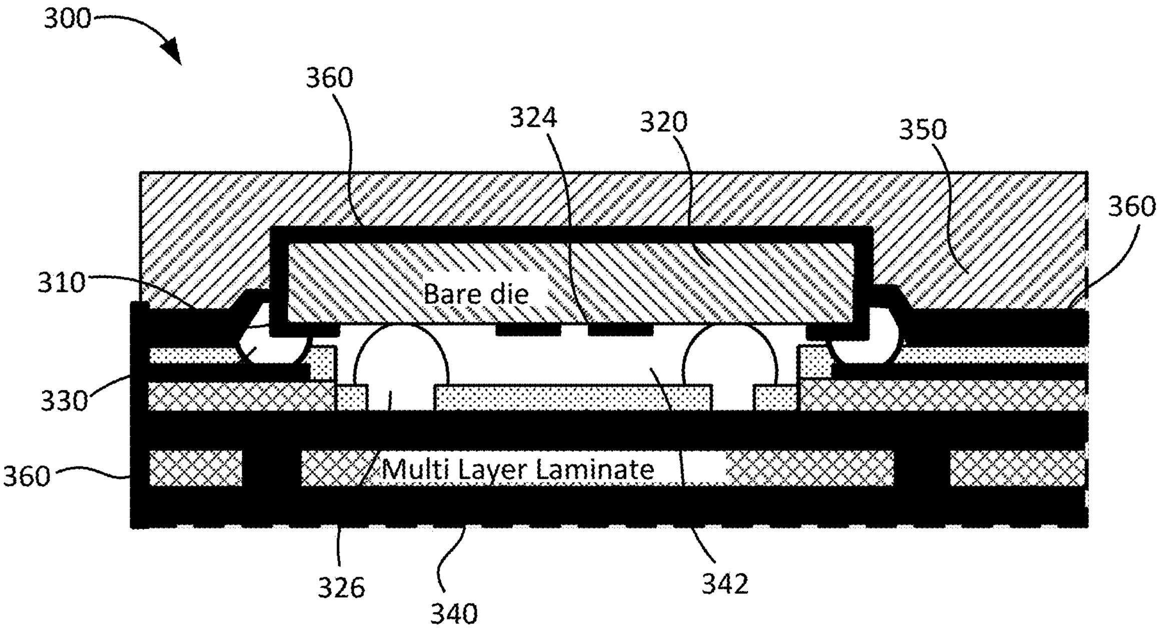
FIG. 3 illustrates a partial cross-sectional view of an apparatus in accordance with one or more aspects of the disclosure.

FIG. 3 illustrates a partial cross-sectional view of an apparatus 300 in accordance with one or more aspects of the disclosure. The apparatus 300 includes a die 320, which may be a bare die. A perimeter metallization 310 is disposed on a perimeter of the die 320. A package substrate 340, which can be a multi-layer laminate substrate, is disposed below the die 320. A seal 330 is coupled to the perimeter metallization 310 and the package substrate 340. The seal 330 is configured to seal the die 320 to the package substrate 340. The apparatus 300 may have a single or multi-die package configuration. The package substrate 340 may include a cavity 342 (e.g., air cavity) around resonators 324 (e.g., acoustic resonators). The cavity 342 may be disposed between the die 320 and package substrate 340. The die 320 is disposed above the cavity 342, but in some aspects the die 320 may also be embedded or at least partially embedded in the cavity 342. The cavity 342 is provided in the package substrate 340, which allows for package height reduction and stiffer connection between die 320 and package substrate 340. The plurality of resonators 324 is disposed on a surface of the die 320 that is sealed along with the cavity 342 by seal 330 and allows for an air filled cavity 342 for the plurality of resonators 324. The die 320 may be electrically coupled to package substrate 340 by connectors 326. In some aspects, a package encapsulant 350 (e.g., mold/Glob-top) is disposed over the die 320 and package substrate 340. In one or more aspects, an electromagnetic shield 360 can be provided, which can improve EMC shielding and provide heatsink/heat spreader functionality. In one or more aspects, the electromagnetic shield can be formed by sputtering copper before the molding process. In addition to other benefits discussed herein, this configuration allows for significantly improved thermal management, with essentially one big heat-sink over die surfaces, connected with die-perimeters close to the heat source.

In some aspects, the electromagnetic shield 360 disposed over the die and at least partially disposed over the package substrate 340. In some aspects, the electromagnetic shield 360 comprises copper. The electromagnetic shield 360 (e.g., EMC Cu shield) can be formed by a sputtering process (e.g., Cu sputtering), which can be performed before molding, instead of after molding (not diced yet, no shield at sides). In some aspects, a half cut-dicing can be performed before molding and Cu-shield sputtering (e.g., the electromagnetic shield 360 does not cover entire package substrate 340). In some aspects, the fabrication process can include top side grinding can be performed after molding, which can expose the die(s) 320, and then Cu-shield sputtering can be performed. In some aspects, the fabrication process can include Cu-shield sputtering before applying solder paste to chip perimeter, similar to chip size solder package-power package (CSSP-PP) fabrication techniques.

Figure 4:
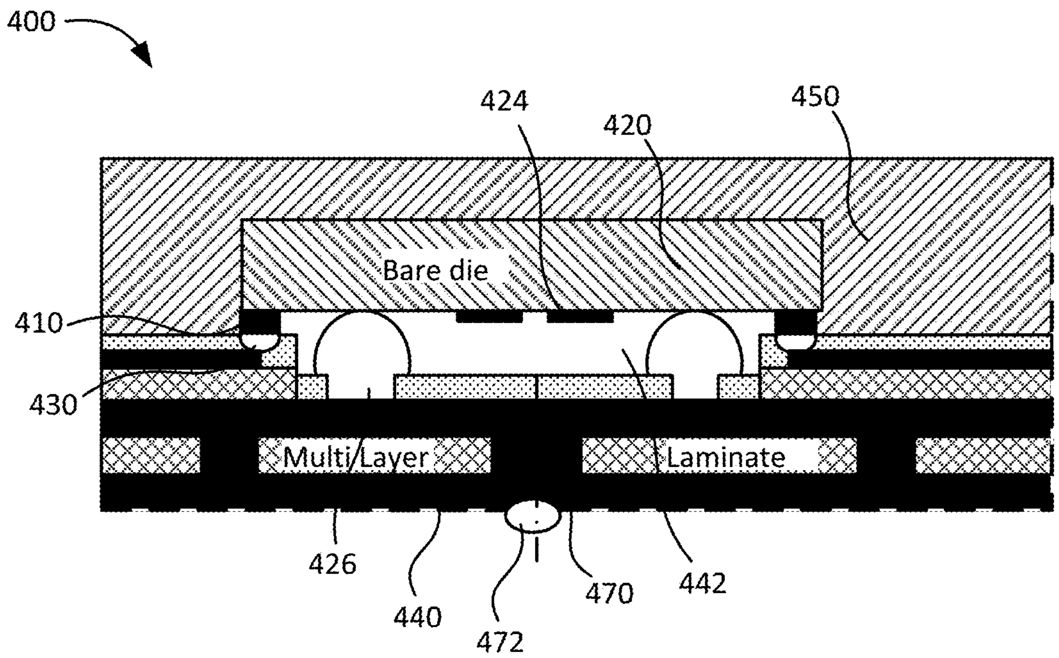
FIG. 4 illustrates a partial cross-sectional view of an apparatus in accordance with one or more aspects of the disclosure.

FIG. 4 illustrates a partial cross-sectional view of an apparatus 400 in accordance with one or more aspects of the disclosure. The apparatus 400 includes a die 420, which may be a bare die. A perimeter metallization 410 is disposed on a perimeter of the die 420. A package substrate 440, which can be a multi-layer laminate substrate, is disposed below the die 420. A seal 430 is coupled to the perimeter metallization 410 and the package substrate 440. The seal 430 is configured to seal the die 420 to the package substrate 440. The apparatus 400 may have a single or multi-die package configuration. The package substrate 440 may include a cavity 442 (e.g., air cavity) around resonators 424 (e.g., acoustic resonators). The die 420 is disposed above the cavity 442, but in some aspects the die 420 may also be embedded or at least partially embedded in the cavity 442. The cavity 442 is provided in the package substrate 440, which allows for package height reduction and stiffer connection between die 420 and package substrate 440. The plurality of resonators 424 is disposed on a surface of the die 420 that is sealed along with the cavity 442 by seal 430 and allows for an air filled cavity 442 for the plurality of resonators 424. The die 420 may be electrically coupled to package substrate 440 by connectors 426. In some aspects, a package encapsulant 450 (e.g., mold/Glob-top) is disposed over the die 420 and package substrate 440. In some aspects, a heat-slug 470 disposed in the package substrate 440. The heat-slug 470 is configured to allow access to the cavity through the package substrate 440. In some aspects, the heat slug 470 has an inner wall covered with copper, e.g., configured as a Copper pipe, which can facilitate the sealing of this hole with solder or other suitable plugging materials. In some aspects, a heat-slug seal 472 configured to seal the heat-slug 470 and the cavity 442 is provided.

In one or more aspects of the disclosure, one of the fabrication challenges is flux cleaning. For example, with Solder balls, conventional fabrication processes can be used, except to address the flux cleaning aspect, heat-slugs 470 in the package substrate are used to access cavity 442 for flux cleaning. Heat slugs 470 need to be sealed after the flux cleaning process, which can be accomplished using heat-slug seals 472. In some aspects, the fabrication process can use evaporating no-clean flux, with or without the heat-slugs 470. In some aspects, the fabrication process can include a CSSP-PP process with solder instead of silver (Ag)-paste. In some aspects, the fabrication process can use copper (Cu) pillars and uses a flux-less copper-tin-copper (Cu—SN—Cu) bonding.

Figure 5:
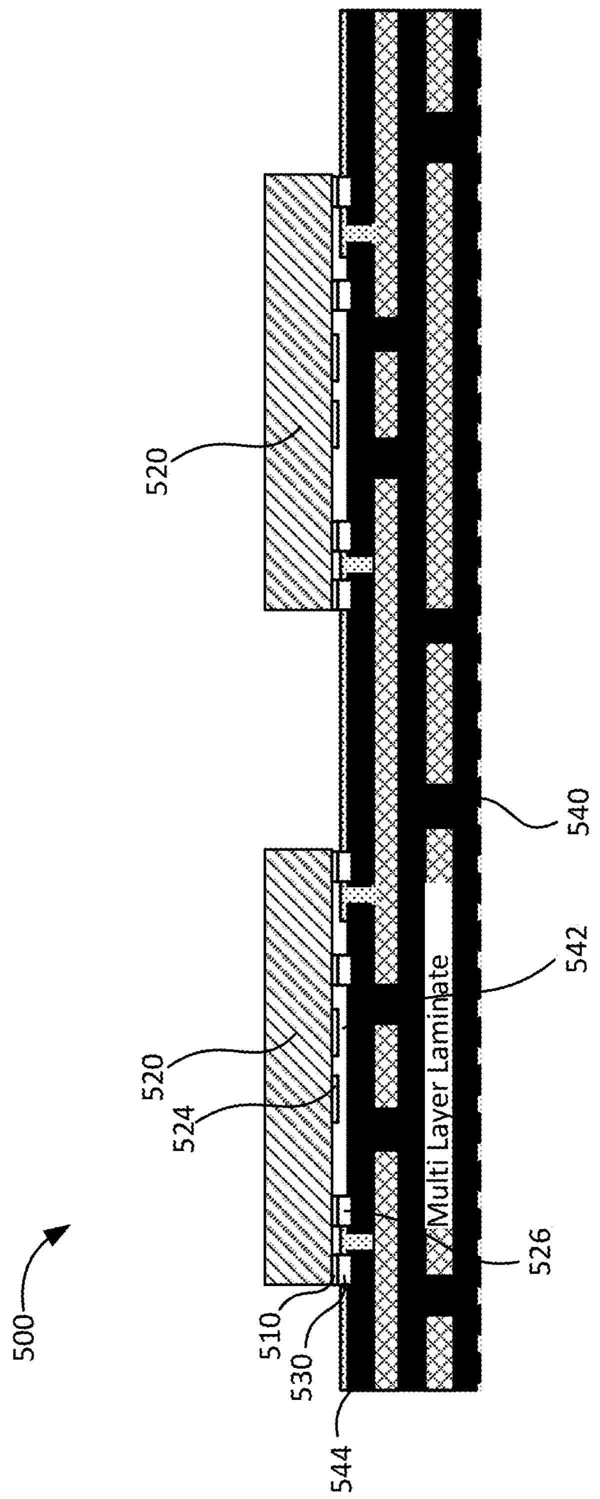
FIG. 5 illustrates a partial cross-sectional view of an apparatus in accordance with one or more aspects of the disclosure.

FIG. 5 illustrates a partial cross-sectional view of an apparatus 500 in accordance with one or more aspects of the disclosure. The apparatus 500 includes dies 520, which may be bare dies. A perimeter metallization 510 is disposed on a perimeter of each die 520. A package substrate 440, which can be a multi-layer laminate substrate, is disposed below the dies 520. A seal 530 is coupled to the perimeter metallization 510 and the package substrate 540. The seal 530 is configured to seal the die 520 to the package substrate 540. The apparatus 500 is a multi-die package configuration. The package substrate 440 does not include a cavity and instead air gap 542 is around resonators 524 (e.g., acoustic resonators). The air gap 542 may be disposed between the die 520 and package substrate 540. The dies 520 may be electrically coupled to package substrate 540 by connectors 526. The perimeter metallization 510 is copper, the seal is tin which is coupled to the package substrate at a metal layer 544 which is copper and forms a copper-tin-copper bond. In some aspects, connectors 526 may be coupled to the dies 520 and package substrate 540 by copper-tin-copper bonding. In some aspects, a fabrication may include a die 520 with perimeter metallization 510 may be provided. A dry film photoresists (DFR) mask may be patterned for a tin (Sn) plating process. The fabrication process can continue with the Sn plating on the perimeter metallization 510 and other exposed copper surfaces. After the plating, the fabrication process can continue with stripping the DFR. During assembly perimeter metallization 510 and other connection points plated with Sn can be directly bonded to exposed copper portions of the package substrate 540.

Figure 6:
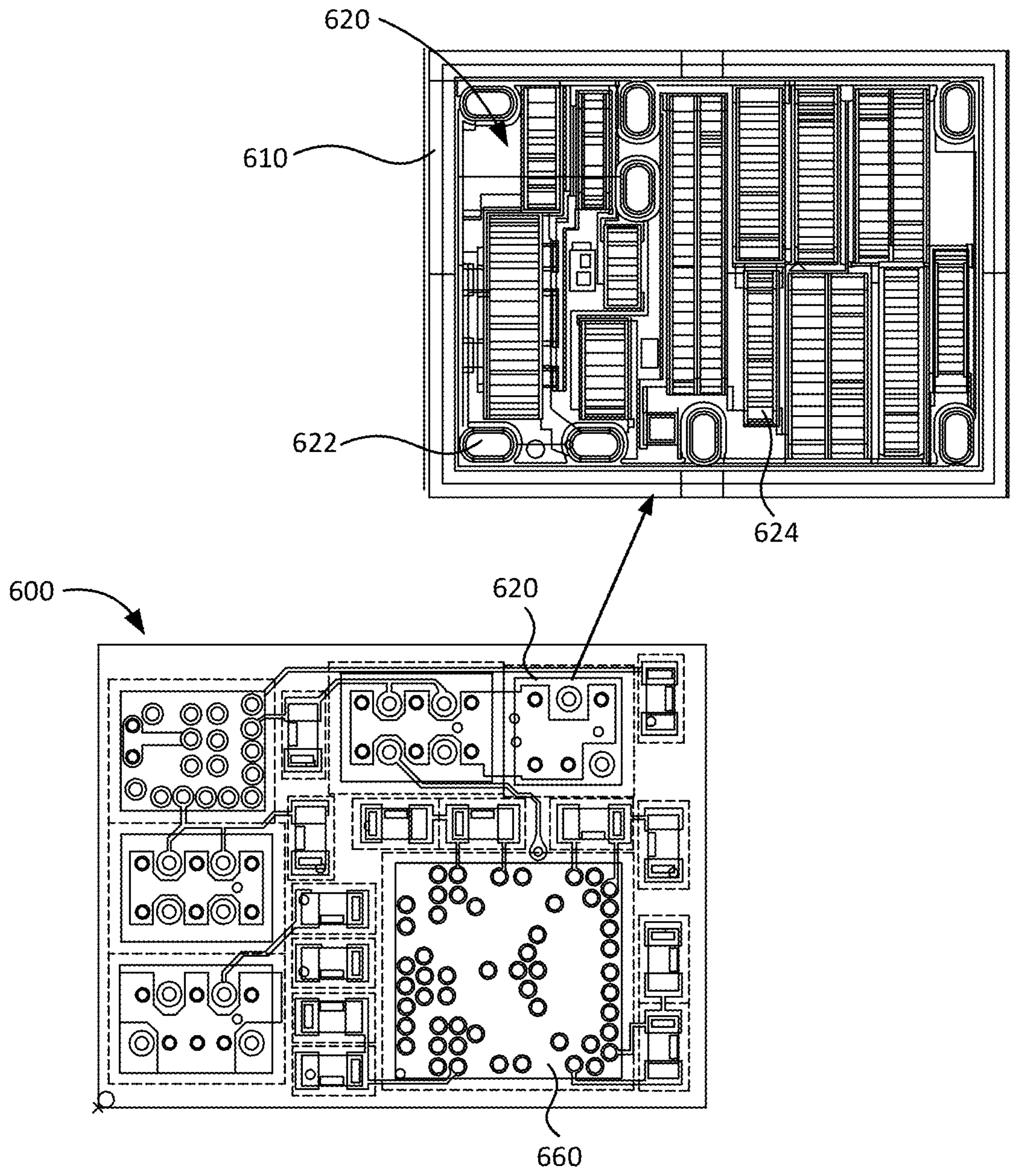
FIG. 6 illustrates a plan view of an apparatus in accordance with one or more aspects of the disclosure.

FIG. 6 illustrates a plan view of an apparatus 600 in accordance with one or more aspects of the disclosure. The apparatus 600 may be a multi-chip molded package including one or more dies mounted to the package substrate, as disclosed herein. For example, die 620 of the apparatus 600 can be similar to the various configurations discussed herein. In one or more aspects, the die 620 has a perimeter metallization 610 (e.g., copper metallization) A plurality of resonators 624 can be coupled to external circuits (e.g., low noise amplifier 660 (LNA 660) through connector pads 622 (under-bump metallization (UBM)) that can be used to couple to connectors (e.g., solder balls). All dies on the apparatus 600 do not need to include perimeter metallization 610 as in the die 620 and associated seal to the package substrate, as discussed herein. However, more than one die in the apparatus 600 may have these features. In some aspects, the die 620 is part of a BAW (Bulk Acoustic Wave) acoustic filter or a SAW (Surface Acoustic Wave) acoustic filter. The apparatus 600 may be a multi-die radio frequency (RF) device, system on a chip (SOC), RF front-end (RFFE) device, etc. and may include multiple components such as, power amplifiers, LNAs, antenna tuners, filters, and switches. The specific designs and components will vary based on the design criteria and functionality of the apparatus 600, so details of the various components will not be further discussed.

Figure 7A:
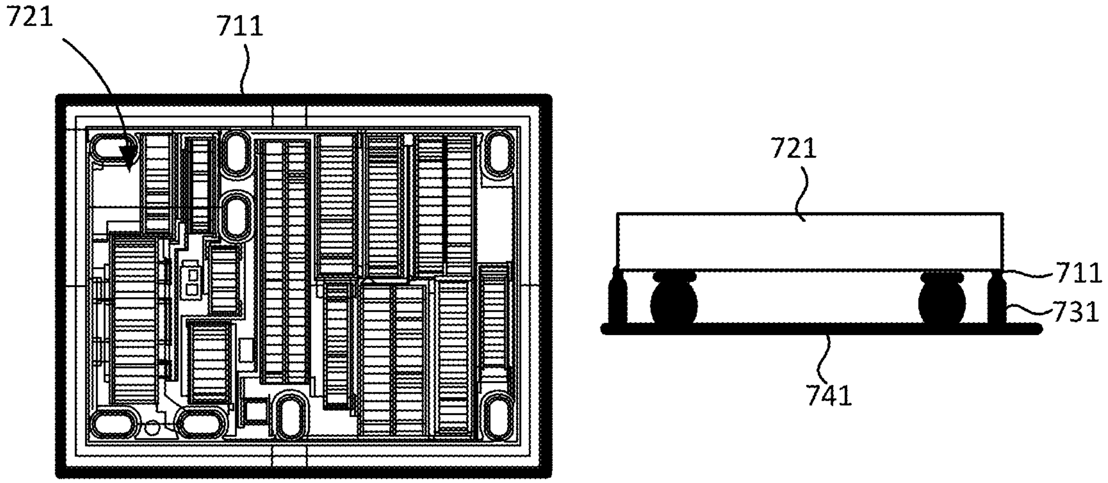
FIGS. 7A-D illustrate partial plan views and related partial cross-sectional views of dies with perimeter metallizations and seals in accordance with one or more aspects of the disclosure.

FIGS. 7A-D illustrate partial plan views and related partial cross-sectional views of an dies with perimeter metallizations and seals in accordance with one or more aspects of the disclosure. Referring to FIG. 7A, a die 721 has a perimeter metallization 711 (e.g., copper metallization). The perimeter metallization 711 is coupled to seal 731, which is configured as a solder dam. The seal 731 is also coupled to the substrate 741.

Figure 7B:
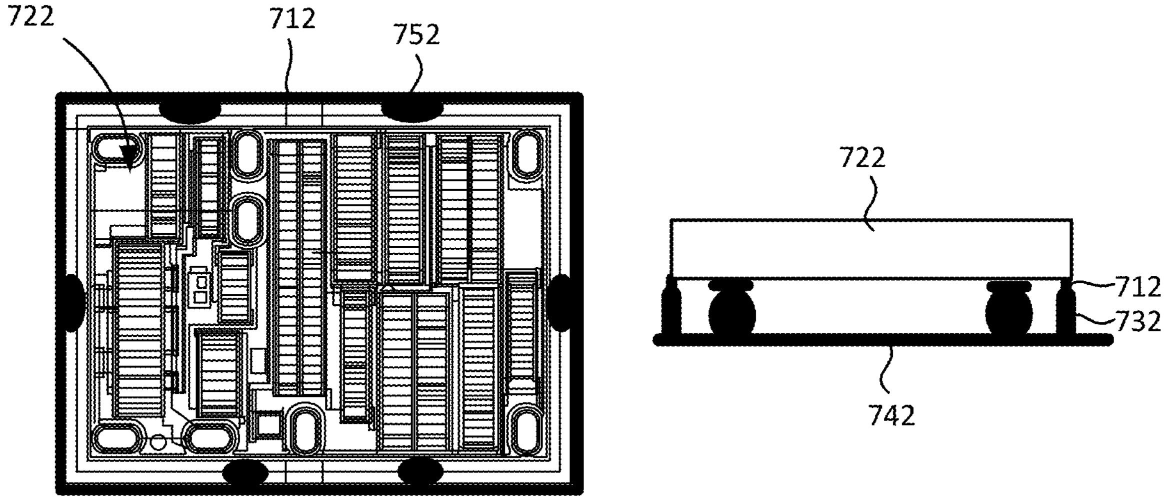

Referring to FIG. 7B, a die 722 has a perimeter metallization 712 (e.g., copper metallization). The perimeter metallization 712 optionally has perimeter pads 752. The perimeter pads 752 allow for larger solder volume, which can improve electrical conductivity, thermal conductivity, and increased mechanical strength. The perimeter metallization 712 is coupled to seal 732, which is configured as a solder dam. The seal 732 is also coupled to the substrate 742.

Figure 7C:
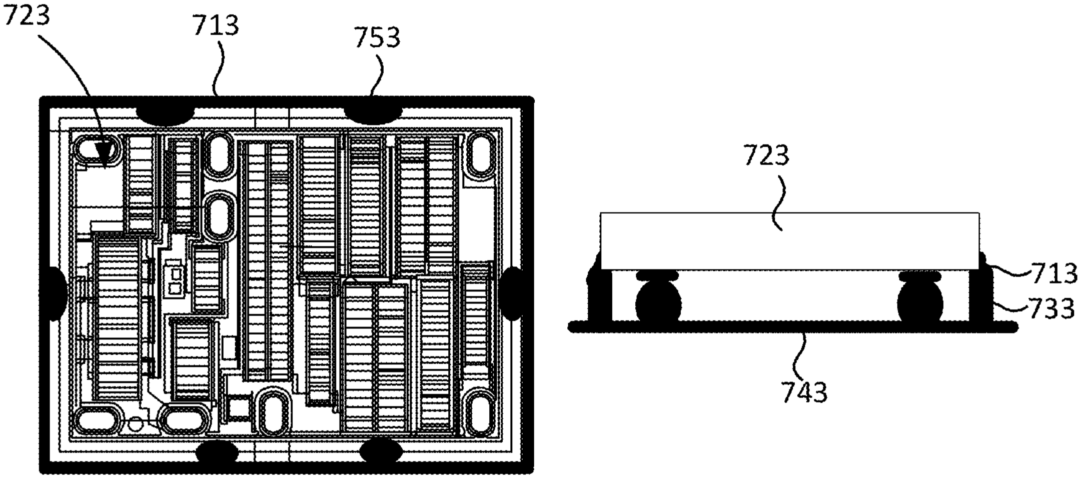

Referring to FIG. 7C, a die 723 has a perimeter metallization 713 (e.g., copper metallization). The perimeter metallization 713 in this configuration extends to the sides of die 723. The perimeter metallization 713 optionally has perimeter pads 753. The perimeter pads 753 allow for larger solder volume, which can improve electrical conductivity, thermal conductivity, and increased mechanical strength. The perimeter metallization 713 is coupled to seal 733, which is configured as a solder dam. The seal 733 is also coupled to the substrate 743.

Referring to FIG. 7C, a die 724 has a perimeter metallization 714 (e.g., copper pillars). The perimeter metallization 714 in this configuration has copper pillars that extend from the die 724. The perimeter metallization 714 optionally has perimeter pads 754. The perimeter pads 754 allow for larger solder volume, which can improve electrical conductivity, thermal conductivity, and increased mechanical strength. The perimeter metallization 714 is coupled to seal 733, which is configured as a solder dam, is coupled to the pillars and in some portions can seal between the pillars of the perimeter metallization 714. The seal 734 is also coupled to the substrate 744.

FIGS. 7A-D illustrate partial plan views and related partial cross-sectional views of dies with perimeter metallizations and seals in accordance with one or more aspects of the disclosure. Referring to FIG. 7A, a die 721 has a perimeter metallization 711 (e.g., copper metallization). The perimeter metallization 711 is coupled to seal 731, which is configured as a solder dam. The seal 731 is also coupled to the substrate 741.

Referring to FIG. 7B, a die 722 has a perimeter metallization 712 (e.g., copper metallization). The perimeter metallization 712 optionally has perimeter pads 752. The perimeter pads 752 allow for larger solder volume, which can improve electrical conductivity, thermal conductivity, and increased mechanical strength. The perimeter metallization 712 is coupled to seal 732, which is configured as a solder dam. The seal 732 is also coupled to the substrate 742.

Referring to FIG. 7C, a die 723 has a perimeter metallization 713 (e.g., copper metallization). The perimeter metallization 713 in this configuration extends to the sides of die 723. The perimeter metallization 713 optionally has perimeter pads 753. The perimeter pads 753 allow for larger solder volume, which can improve electrical conductivity, thermal conductivity, and increased mechanical strength. The perimeter metallization 713 is coupled to seal 733, which is configured as a solder dam. The seal 733 is also coupled to the substrate 743.

Figure 7D:
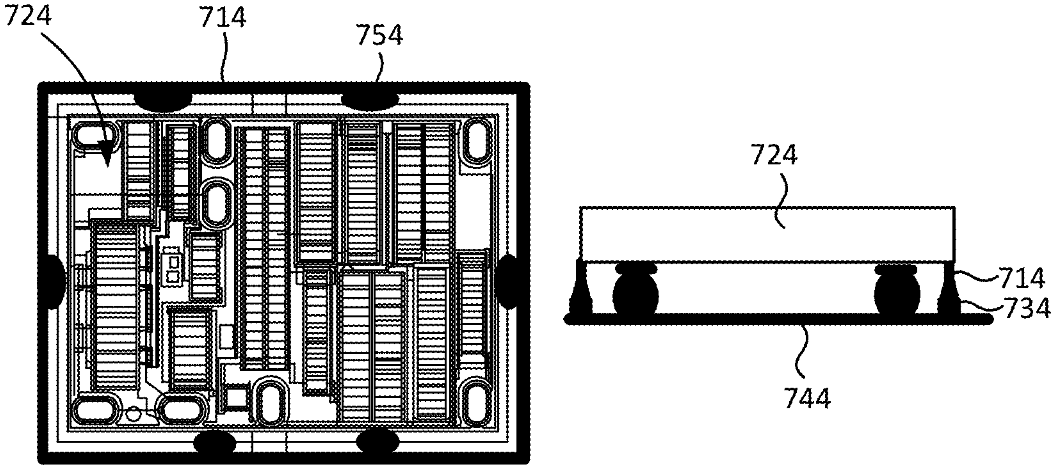

Referring to FIG. 7D, a die 724 has a perimeter metallization 714 (e.g., copper pillars). The perimeter metallization 714 in this configuration has copper pillars that extend from the die 724. The perimeter metallization 714 optionally has perimeter pads 754. The perimeter pads 754 allow for larger solder volume, which can improve electrical conductivity, thermal conductivity, and increased mechanical strength. The perimeter metallization 714 is coupled to seal 733, which is configured as a solder dam, is coupled to the pillars and in some portions can seal between the pillars of the perimeter metallization 714. The seal 734 is also coupled to the substrate 744.

Figure 8A:
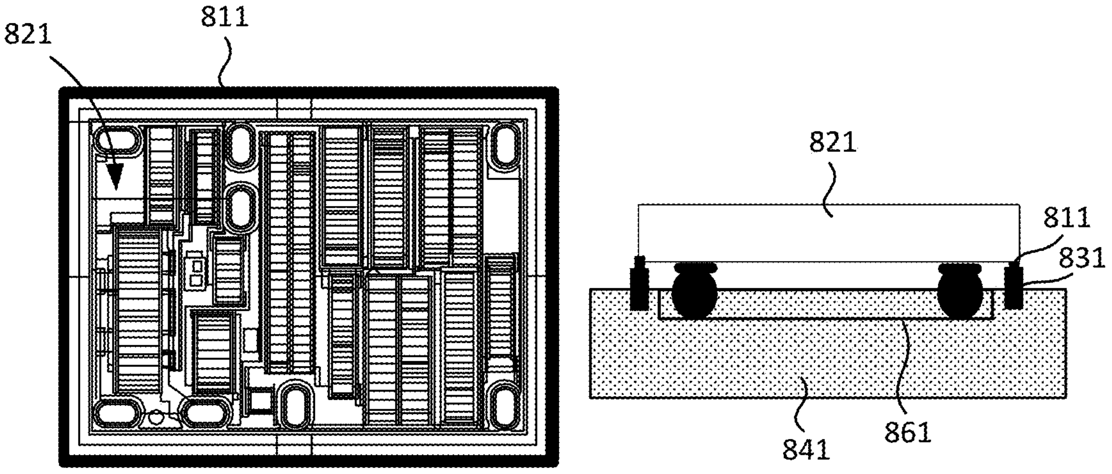
FIGS. 8A-E illustrate partial plan views and related partial cross-sectional views of dies with perimeter metallizations, seals and package substrates with cavities in accordance with one or more aspects of the disclosure.

FIGS. 8A-E illustrate partial plan views and related partial cross-sectional views of dies with perimeter metallizations, seals and package substrates with cavities in accordance with one or more aspects of the disclosure. Referring to FIG. 8A, a die 821 has a perimeter metallization 811 (e.g., copper metallization). The perimeter metallization 811 is coupled to seal 831, which is coupled to the package substrate 841 outside the perimeter of a cavity 861 in the package substrate 841.

Figure 8B:
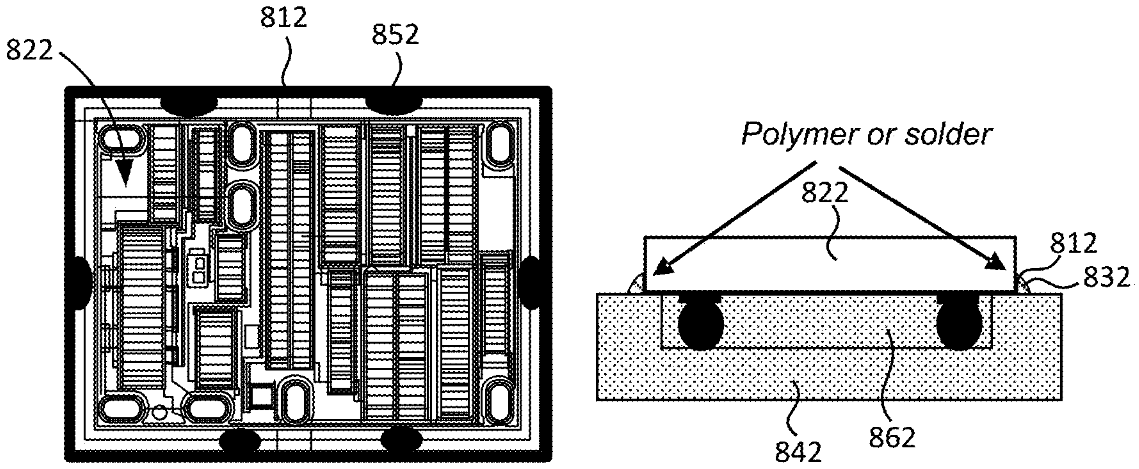

Referring to FIG. 8B, a die 822 has a perimeter metallization 812 (e.g., copper metallization). The perimeter metallization 812 optionally has perimeter pads 852. The perimeter pads 852 allow for larger solder volume, which can improve electrical conductivity, thermal conductivity, and increased mechanical strength. The perimeter metallization 812 may be disposed on portions of the bottom and sides of the die 822. The perimeter metallization 812 is coupled to seal 832, which is configured as a polymer or solder dam. The perimeter metallization 812 is coupled to seal 832, which is coupled to the package substrate 842 outside the perimeter of a cavity 862. In this configuration, the die 822 is disposed closely to the surface of the package substrate 842.

Figure 8C:
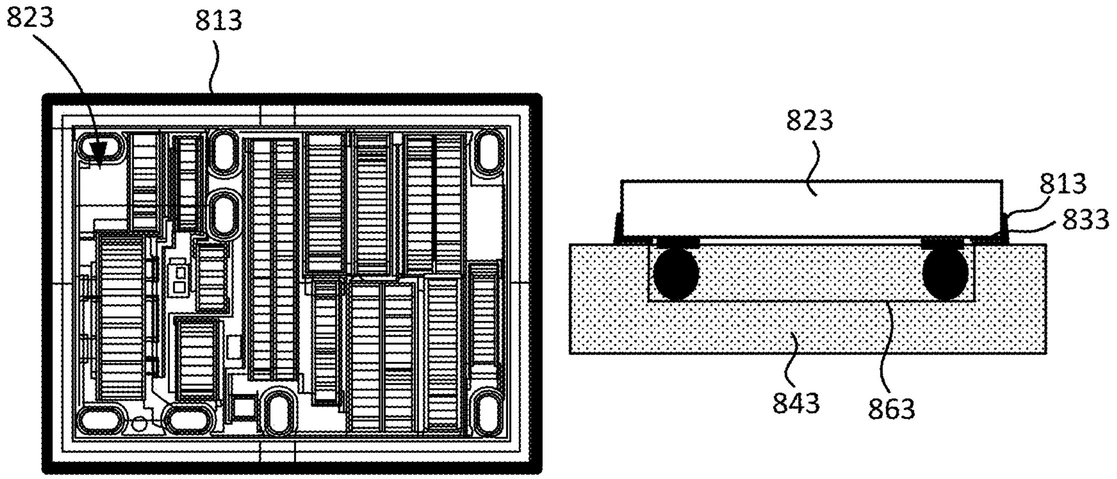

Referring to FIG. 8C, a die 823 has a perimeter metallization 813 (e.g., copper metallization). The perimeter metallization 813 may be disposed on portions of the bottom and sides of the die 823. The perimeter metallization 813 is coupled to seal 833, which may be solder coupled to the bottom and sides of the perimeter metallization 813. The perimeter metallization 813 is coupled to seal 833, which is coupled to the package substrate 843 outside the perimeter of a cavity 863. In this configuration, the die 823 is disposed closely to the surface of the package substrate 843.

Figure 8D:
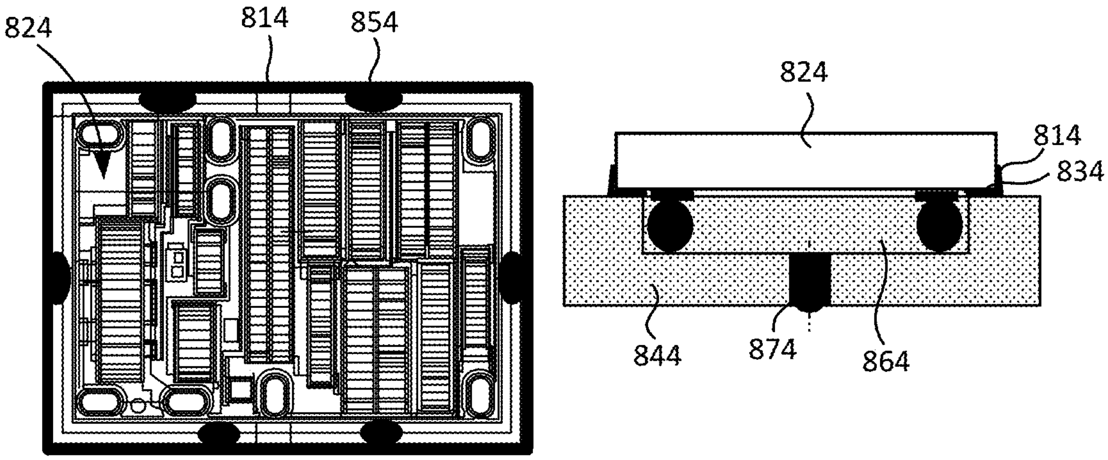

Referring to FIG. 8D, a die 824 has a perimeter metallization 814 (e.g., copper metallization). The perimeter metallization 814 optionally has perimeter pads 854. The perimeter pads 854 allow for larger solder volume, which can improve electrical conductivity, thermal conductivity, and increased mechanical strength. The perimeter metallization 814 may be disposed on portions of the bottom and sides of the die 824. The perimeter metallization 814 is coupled to seal 834, which is configured as solder that extends to perimeter metallization 814 on the sides of the die 824. The perimeter metallization 814 is coupled to seal 834, which is coupled to the package substrate 844 outside the perimeter of a cavity 864. In this configuration, a heat-slug 874 (or plurality of heat slugs), which can be configured as a hollow tube or hollow through-via, and can be used to control atmosphere inside cavity during fabrication. The heat-slug 874 is closed at the bottom with a heat-slug seal, which may be solder or any suitable material.

Figure 8E:
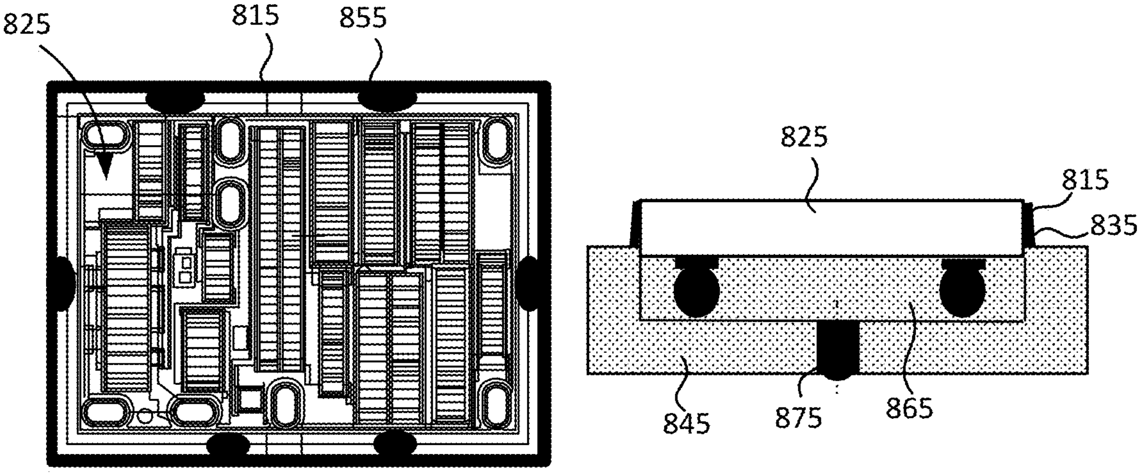

Referring to FIG. 8E, a die 825 has a perimeter metallization 815 (e.g., copper metallization). The perimeter metallization 815 optionally has perimeter pads 855. The perimeter pads 855 allow for larger solder volume, which can improve electrical conductivity, thermal conductivity, and increased mechanical strength. The perimeter metallization 815 may be disposed on sides of the die 825. The perimeter metallization 815 is coupled to seal 835, which is configured as solder that extends to perimeter metallization 815 on the sides of the die 825. The perimeter metallization 815 is coupled to seal 835, which is coupled to the package substrate 845. A heat slug 875 (or plurality of heat slugs), which can be configured as a hollow tube or hollow through-via. The heat-slug 875 is closed at bottom with a heat-slug seal, which may be solder or any suitable material. In this configuration, it will be noted that the die 825 is at least partially embedded in the cavity 865. This provides greater height reduction than the configurations with the die on top of the package substrate 845. In further aspects, as discussed herein the die may be embedded in the cavity 865 and the perimeter metallization 815 and seal 835 may be coupled to the sidewalls of the cavity 865.

It will be appreciated that foregoing examples are not intended to limit the various aspects discloses and various alternatives will be apparent to those skilled in the art. For example, in various aspects the perimeter metallization may include at least one of a plurality of conductive pillars, a conductive film, a sputtered conductive layer, may be part of a copper-tin-copper bond, or any other suitable conductive structure. In some aspects, the perimeter metallization comprises at least one of copper, silver, tin, gold, aluminum, solder, alloys, or combinations thereof. In some aspects, the seal comprises at least one of solder, silver, tin, solder paste, silver paste, polymer, or combinations thereof. Accordingly, it will be appreciated that the foregoing illustrations were provided merely as examples to aid in the explanation of the various aspects and should not be construed to limit the various aspects to the combinations, components, and/or arrangements provided.

Figure 9:
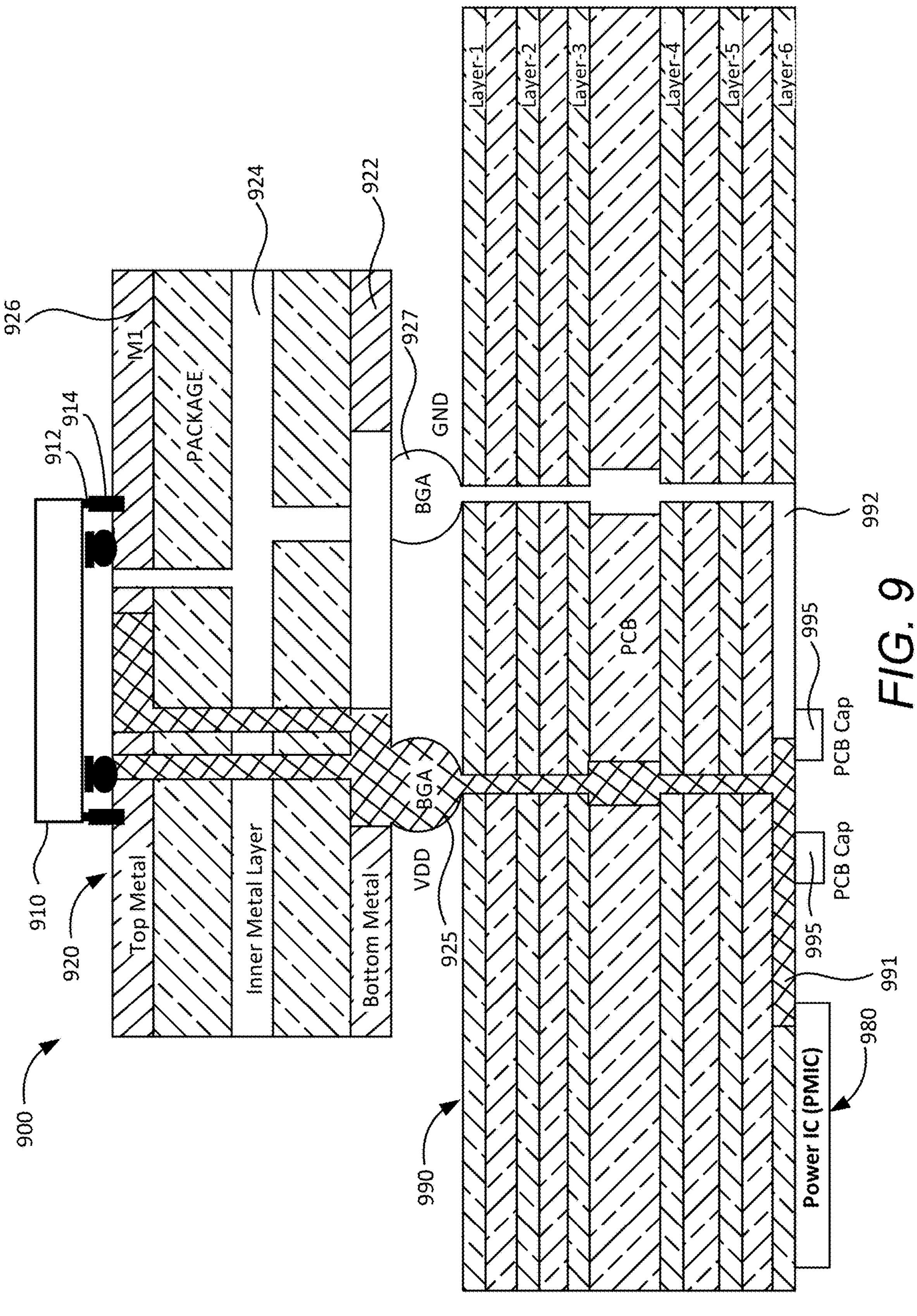
FIG. 9 illustrates components of an integrated device in accordance with one or more aspects of the disclosure.

FIG. 9 illustrates components of an integrated device 900 according to one or more aspects of the disclosure. Regardless of the various configurations of the single die or multi die packages discussed above, it will be appreciated that the package substrate 920 may be configured to couple the die 910 to a printed circuit board 990 (PCB 990). The die 910 may include a perimeter metallization 912, which is coupled a seal 914 that is coupled to the package substrate 920. The PCB 990 is also coupled to a power supply 980 (e.g., a power management integrated circuit (PMIC)), which allows the package substrate 920 and the die 910 to be electrically coupled to the PMIC 980. Specifically, one or more power supply (VDD) lines 991 and one or more ground (GND) lines 992 may be coupled to the PMIC 980 to distribute power to the PCB 990, package substrate 920 via VDD BGA pin 925 and GND BGA pin 927 and to the die 910 coupled to the top metal layer/M1 layer 926 of package substrate 920. The package substrate 920 has a bottom metal layer 922 and may have one or more inner metal layers 924, as is known in the art. It will be appreciated that the various aspects disclosed are not limited to any specific number of metal layers in the package substrate 920. The VDD line 991 and GND line 992 each may be formed from traces, shapes, or patterns in one or more metal layers of the PCB 990 (e.g., layers 1-6) coupled by one or more vias through insulating layers separating the metal layers 1-6 in the PCB 990. The PCB 990 may have one or more PCB capacitors (PCB cap) 995 that can be used to condition the power supply signals, as is known to those skilled in the art. Additional connections and devices may be coupled to and/or pass through the PCB 990 to the package substrate 920 via one or more additional BGA pins (not illustrated) on the package substrate 920. It will be appreciated that the illustrated configuration and descriptions are provided merely to aid in the explanation of the various aspects disclosed herein. For example, the PCB 990 may have more or less metal and insulating layers, there may be multiple lines providing power to the various components, etc. Accordingly, the forgoing illustrative examples and associated figures should not be construed to limit the various aspects disclosed and claimed herein In order to fully illustrate aspects of the design of the present disclosure, methods of fabrication are discussed herein in relation to the various aspects disclosed. Other methods of fabrication are possible, and discussed fabrication methods are presented only to aid understanding of the concepts disclosed herein. It will be appreciated that any of the fabrication processes discussed were provided merely as general illustrations of some of the aspects of the disclosure and are not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

Figure 10:
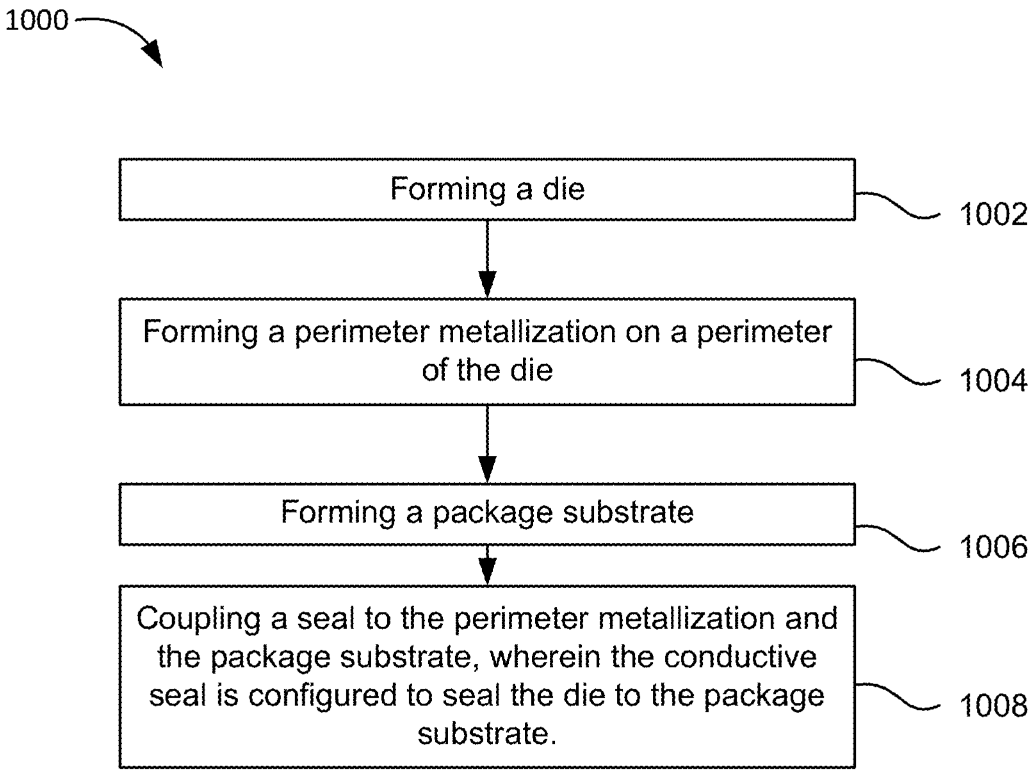
FIG. 10 illustrates a flowchart of a method for manufacturing a device in accordance with one or more aspects of the disclosure.

It will be appreciated from the foregoing that there are various methods for fabricating devices disclosed herein. FIG. 10 illustrates a flowchart of a method 1000 for fabricating an apparatus (e.g., 100, 200, 300, 400, 500, 600). The method can include forming a die, at block 1002. It will be appreciated that forming may include obtaining previously providing/formed dies as many components may be fabricated at different factories/fabrication facilities. The method further includes forming a perimeter metallization on a perimeter of the die, at block 1004. Forming the perimeter metallization may be performed by any of the techniques discussed herein, or any suitable processes known in the art, which may vary depending on the specific configuration, e.g., Cu pillars, Cu trace/plate, etc. The method further includes forming a package substrate, at block 1006. It will be appreciated that forming may include providing/obtaining previously formed dies as many components may be fabricated at different factories/fabrication facilities. The method further includes coupling a seal to the perimeter metallization and the package substrate, wherein the seal is configured to seal the die to the package substrate, at block 1008. Coupling the seal to the perimeter metallization and the package substrate may be performed by any of the techniques discussed herein, or any suitable processes known in the art, which may vary depending on the specific configuration, e.g., solder balls, solder paste, silver paste, solder printing, etc. It will be appreciated that the foregoing fabrication method is provided at a high level to highlight the fabrication of general novel aspects of the various aspects disclosed and is not intended to provide for detailed fabrication procedures, which can vary according to the various designs, as is known in the art.

Accordingly, it will be appreciated from the foregoing disclosure that additional processes for fabricating the various aspects disclosed herein will be apparent to those skilled in the art and a literal rendition of the detailed processes related to the processes discussed above will not be provided or illustrated in the included drawings. It will be appreciated that the sequence of the fabrication processes are not necessarily in any order and later processes may be discussed earlier for convenience and to provide an example of the breadth of the various aspects disclosed.

The foregoing disclosed devices and functionalities may be designed and stored in computer files (e.g., register-transfer level (RTL), Geometric Data Stream (GDS) Gerber, and the like) stored on computer-readable media. Some or all such files may be provided to fabrication handlers who fabricate devices based on such files. Resulting products may include various components, including semiconductor wafers that are then cut into semiconductor die and packaged into semiconductor packages, integrated devices, package on package devices, system-on-chip devices, and the like, which may then be employed in the various devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

Figure 11:
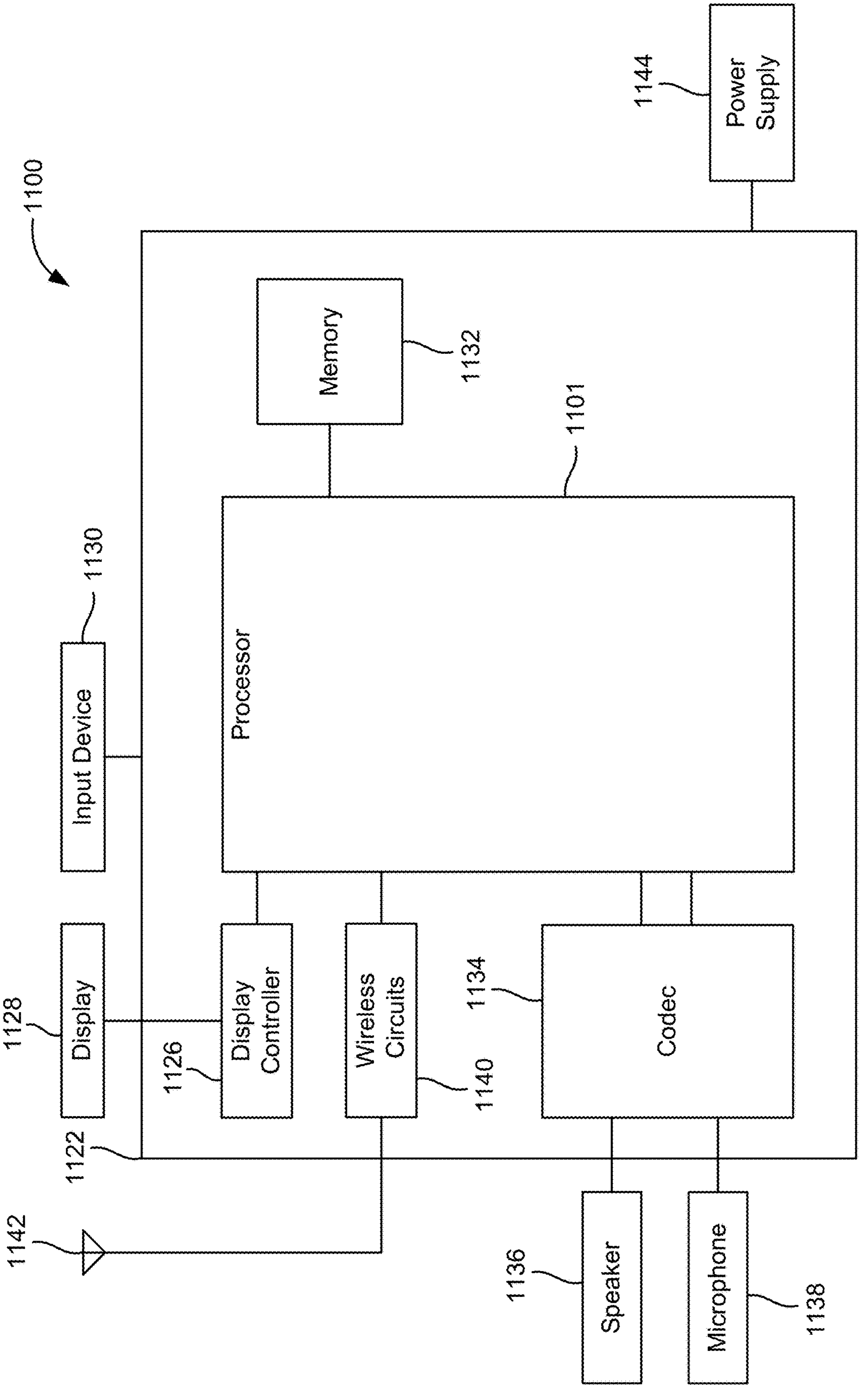
FIG. 11 illustrates an exemplary mobile device in accordance with one or more aspects of the disclosure.

FIG. 11 illustrates an exemplary mobile device in accordance with some examples of the disclosure Referring now to FIG. 11, a block diagram of a mobile device that is configured according to exemplary aspects is depicted and generally designated mobile device 1100. In some aspects, mobile device 1100 may be configured as a wireless communication device. As shown, mobile device 1100 includes processor 1101. Processor 1101 may be communicatively coupled to memory 1132 over a link, which may be a die-to-die or chip-to-chip link. Mobile device 1100 also includes display 1128 and display controller 1126, with display controller 1126 coupled to processor 1101 and to display 1128.

In some aspects, FIG. 11 may include coder/decoder (CODEC) 1134 (e.g., an audio and/or voice CODEC) coupled to processor 1101; speaker 1136 and microphone 1138 coupled to CODEC 1134; and wireless circuits 1140 (which may include a modem, RF circuitry, filters, etc., which may be implemented using one or more of the sealed die configurations (e.g., the solder sealed chip enclosure) including acoustic filter technologies (e.g. BAW, SAW, etc.), as disclosed herein) coupled to wireless antenna 1142 and to processor 1101.

In a particular aspect, where one or more of the above-mentioned blocks are present, processor 1101, display controller 1126, memory 1132, CODEC 1134, and wireless circuits 1140 can be included in a system-in-package or system-on-chip device 1122 which may be implemented in whole or part using the various aspects disclosed herein. Input device 1130 (e.g., physical, or virtual keyboard), power supply 1144 (e.g., battery), display 1128, input device 1130, speaker 1136, microphone 1138, wireless antenna 1142, and power supply 1144 may be external to system-on-chip device 1122 and may be coupled to a component of system-on-chip device 1122, such as an interface or a controller.

It should be noted that although FIG. 11 depicts a mobile device 1100, processor 1101 and memory 1132 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 12:
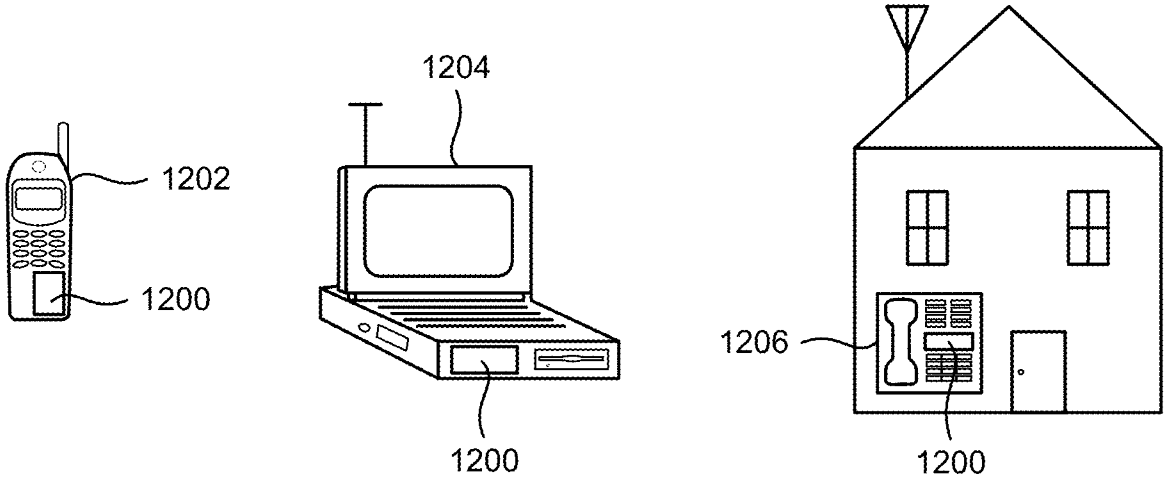
FIG. 12 illustrates various electronic devices that may be integrated with any of the devices disclosed in accordance with one or more aspects of the disclosure.

FIG. 12 illustrates various electronic devices that may be integrated with any of the aforementioned single die/multi-die/molded multi-chip devices in accordance with various examples of the disclosure. For example, a mobile phone device 1202, a laptop computer device 1204, and a fixed location terminal device 1206 may each be considered generally user equipment (UE) and may include a semiconductor device 1200 as described herein. The semiconductor device 1200 may be, for example, any of the integrated circuits, dies, integrated devices, integrated device packages, integrated circuit devices, device packages, integrated circuit (IC) packages, single die/multi-die/molded multi-chip devices, etc. described herein. The devices 1202, 1204, 1206 illustrated in FIG. 12 are merely exemplary. Other electronic devices may also feature the semiconductor device 1200 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1A-12 may be rearranged and/or combined into a single component, process, feature, or function or incorporated in several components, processes, or functions. Additional elements, components, processes, and/or functions may also be added without departing from the disclosure. It should also be noted that FIGS. 1A-12 and corresponding description in the present disclosure are not limited to dies and/or ICs. In some implementations, FIGS. 1A-12 and the corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a system in package (SiP), a system on chip (SoC), a package on package (PoP) device, and the like.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. UEs can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage, or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it is understood that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer, or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses.

Clause 1. An apparatus comprising: a die; a perimeter metallization disposed on a perimeter of the die; a package substrate; and a seal coupled to the perimeter metallization and the package substrate, wherein the seal is configured to seal the die to the package substrate.

Clause 2. The apparatus of clause 1, further comprising: a cavity disposed in the package substrate, wherein the die is disposed on an open side of the cavity and the seal is configured to seal the cavity.

Clause 3. The apparatus of clause 2, further comprising: a plurality of resonators disposed on a surface of the die that is sealed in with the cavity.

Clause 4. The apparatus of clause 3, wherein the die and the package substrate form at least one of a Bulk Acoustic Wave (BAW) acoustic filter or Surface Acoustic Wave (SAW) acoustic filter.

Clause 5. The apparatus of any of clauses 2 to 4, wherein the die is at least partially embedded in the cavity.

Clause 6. The apparatus of clause 5, wherein the perimeter metallization is disposed at least partially on a side of the die.

Clause 7. The apparatus of clause 6, wherein the seal is coupled at least partially to a sidewall of the cavity.

Clause 8. The apparatus of any of clauses 2 to 7, wherein the die is disposed above the cavity.

Clause 9. The apparatus of clause 8, wherein the perimeter metallization is disposed on a bottom of the die facing the package substrate.

Clause 10. The apparatus of clause 9, wherein the seal is coupled at least partially to a topside of package substrate facing the die.

Clause 11. The apparatus of any of clauses 2 to 10, further comprising: a heat-slug disposed in the package substrate, wherein the heat-slug is configured to allow access to the cavity through the package substrate.

Clause 12. The apparatus of clause 11, further comprising: a heat-slug seal configured to seal the heat-slug and the cavity.

Clause 13. The apparatus of any of clauses 1 to 12, further comprising: an electromagnetic shield disposed over the die and at least partially disposed over the package substrate.

Clause 14. The apparatus of clause 13, wherein the electromagnetic shield is disposed between the die and a package encapsulant.

Clause 15. The apparatus of any of clauses 1 to 14, further comprising: a package encapsulant disposed over the die and at least partially disposed over the package substrate.

Clause 16. The apparatus of any of clauses 1 to 15, wherein the perimeter metallization further comprises a plurality of perimeter pads.

Clause 17. The apparatus of any of clauses 1 to 16, wherein the perimeter metallization comprises at least one of copper, silver, tin, gold, aluminum, solder, alloys, or combinations thereof.

Clause 18. The apparatus of any of clauses 1 to 17, wherein the perimeter metallization comprises at least one of a plurality of conductive pillars, a conductive film, a sputtered conductive layer, part of a copper-tin-copper bond, or combinations thereof.

Clause 19. The apparatus of any of clauses 1 to 18, wherein the seal comprises at least one of solder, silver, tin, solder paste, silver paste, polymer, or combinations thereof.

Clause 20. The apparatus of any of clauses 1 to 19, wherein the apparatus comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

Clause 21. A method for fabricating an apparatus, the method comprising: forming a die; forming a perimeter metallization on a perimeter of the die; forming a package substrate; and coupling a seal to the perimeter metallization and the package substrate, wherein the seal is configured to seal the die to the package substrate.

Clause 22. The method of clause 21, further comprising: forming a cavity disposed in the package substrate, wherein the die is disposed on an open side of the cavity and the seal is configured to seal the cavity.

Clause 23. The method of clause 22, further comprising: forming a plurality of resonators disposed on a surface of the die that is sealed in with the cavity.

Clause 24. The method of clause 23, wherein the die and the package substrate form at least one of a Bulk Acoustic Wave (BAW) acoustic filter or Surface Acoustic Wave (SAW) acoustic filter.

Clause 25. The method of any of clauses 22 to 24, wherein the die is at least partially embedded in the cavity.

Clause 26. The method of clause 25, wherein the perimeter metallization is disposed at least partially on a side of the die.

Clause 27. The method of clause 26, wherein the seal is coupled at least partially to a sidewall of the cavity.

Clause 28. The method of any of clauses 22 to 27, wherein the die is disposed above the cavity.

Clause 29. The method of clause 28, wherein the perimeter metallization is disposed on a bottom of the die facing the package substrate.

Clause 30. The method of clause 29, wherein the seal is coupled at least partially to a topside of package substrate facing the die.

Clause 31. The method of any of clauses 22 to 30, further comprising: forming a heat-slug disposed in the package substrate, wherein the heat-slug is configured to allow access to the cavity through the package substrate.

Clause 32. The method of clause 31, further comprising: forming a heat-slug seal configured to seal the heat-slug and the cavity.

Clause 33. The method of any of clauses 21 to 32, further comprising: forming an electromagnetic shield disposed over the die and at least partially disposed over the package substrate.

Clause 34. The method of clause 33, wherein the electromagnetic shield is disposed between the die and a package encapsulant.

Clause 35. The method of any of clauses 21 to 34, further comprising: disposing a package encapsulant over the die and at least partially over the package substrate.

Clause 36. The method of any of clauses 21 to 35, wherein the perimeter metallization further comprises a plurality of perimeter pads.

Clause 37. The method of any of clauses 21 to 36, wherein the perimeter metallization comprises at least one of copper, silver, tin, gold, aluminum, solder, alloys, or combinations thereof.

Clause 38. The method of any of clauses 21 to 37, wherein the perimeter metallization comprises at least one of a plurality of conductive pillars, a conductive film, a sputtered conductive layer, part of a copper-tin-copper bond, or combinations thereof.

Clause 39. The method of any of clauses 21 to 38, wherein the seal comprises at least one of solder, silver, tin, solder paste, silver paste, polymer, or combinations thereof.

Clause 40. The method of any of clauses 21 to 39, wherein the apparatus comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An apparatus comprising:

a die;

a perimeter metallization disposed on a perimeter of the die;

a package substrate; and a seal coupled to the perimeter metallization and the package substrate, wherein the seal is configured to seal the die to the package substrate;

wherein the perimeter metallization continuously extends along the perimeter of the die.

2. The apparatus of claim 1, further comprising:

a cavity disposed in the package substrate, wherein the die is disposed on an open side of the cavity and the seal is configured to seal the cavity.

3. The apparatus of claim 2, further comprising:

a plurality of resonators disposed on a surface of the die that is sealed in with the cavity.

4. The apparatus of claim 3, wherein the die and the package substrate form at least one of a Bulk Acoustic Wave (BAW) acoustic filter or Surface Acoustic Wave (SAW) acoustic filter.

5. The apparatus of claim 2, wherein the die is at least partially embedded in the cavity.

6. The apparatus of claim 5, wherein the perimeter metallization is disposed at least partially on a side of the die.

7. The apparatus of claim 6, wherein the seal is coupled at least partially to a sidewall of the cavity.

8. The apparatus of claim 2, wherein the die is disposed above the cavity.

9. The apparatus of claim 8, wherein the perimeter metallization is disposed on a bottom of the die facing the package substrate.

10. The apparatus of claim 9, wherein the seal is coupled at least partially to a topside of the package substrate facing the die.

11. The apparatus of claim 2, further comprising:

a heat-slug disposed in the package substrate, wherein the heat-slug is configured to allow access to the cavity through the package substrate.

12. The apparatus of claim 11, further comprising:

a heat-slug seal configured to seal the heat-slug and the cavity.

13. The apparatus of claim 1, further comprising:

an electromagnetic shield disposed over the die and at least partially disposed over the package substrate.

14. The apparatus of claim 13, wherein the electromagnetic shield is disposed between the die and a package encapsulant.

15. The apparatus of claim 1, further comprising:

a package encapsulant disposed over the die and at least partially disposed over the package substrate.

16. The apparatus of claim 1, wherein the perimeter metallization further comprises a plurality of perimeter pads.

17. The apparatus of claim 1, wherein the perimeter metallization comprises at least one of copper, silver, tin, gold, aluminum, solder, alloys, or combinations thereof.

18. The apparatus of claim 1, wherein the perimeter metallization comprises at least one of a plurality of conductive pillars, a conductive film, a sputtered conductive layer, part of a copper-tin-copper bond, or combinations thereof.

19. The apparatus of claim 1, wherein the seal comprises at least one of solder, silver, tin, solder paste, silver paste, polymer, or combinations thereof.

20. The apparatus of claim 1, wherein the apparatus comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

21. A method for fabricating an apparatus, the method comprising:

forming a die;

forming a perimeter metallization on a perimeter of the die;

forming a package substrate; and coupling a seal to the perimeter metallization and the package substrate, wherein the seal is configured to seal the die to the package substrate;

wherein the perimeter metallization continuously extends along the perimeter of the die.

22. The method of claim 21, further comprising:

forming a cavity disposed in the package substrate, wherein the die is disposed on an open side of the cavity and the seal is configured to seal the cavity.

23. The method of claim 22, further comprising:

forming a plurality of resonators disposed on a surface of the die that is sealed in with the cavity.

24. The method of claim 23, wherein the die and the package substrate form at least one of a Bulk Acoustic Wave (BAW) acoustic filter or Surface Acoustic Wave (SAW) acoustic filter.

25. The method of claim 22, wherein the die is at least partially embedded in the cavity.

26. The method of claim 25, wherein the perimeter metallization is disposed at least partially on a side of the die.

27. The method of claim 26, wherein the seal is coupled at least partially to a sidewall of the cavity.

28. The method of claim 22, wherein the die is disposed above the cavity.

29. The method of claim 28, wherein the perimeter metallization is disposed on a bottom of the die facing the package substrate.

30. The method of claim 29, wherein the seal is coupled at least partially to a topside of package substrate facing the die.

31. The method of claim 22, further comprising:

forming a heat-slug disposed in the package substrate, wherein the heat-slug is configured to allow access to the cavity through the package substrate.

32. The method of claim 31, further comprising:

forming a heat-slug seal configured to seal the heat-slug and the cavity.

33. The method of claim 21, further comprising:

forming an electromagnetic shield disposed over the die and at least partially disposed over the package substrate.

34. The method of claim 33, wherein the electromagnetic shield is disposed between the die and a package encapsulant.

35. The method of claim 21, further comprising:

disposing a package encapsulant over the die and at least partially over the package substrate.

36. The method of claim 21, wherein the perimeter metallization further comprises a plurality of perimeter pads.

37. The method of claim 21, wherein the perimeter metallization comprises at least one of copper, silver, tin, gold, aluminum, solder, alloys, or combinations thereof.

38. The method of claim 21, wherein the perimeter metallization comprises at least one of a plurality of conductive pillars, a conductive film, a sputtered conductive layer, part of a copper-tin-copper bond, or combinations thereof.

39. The method of claim 21, wherein the seal comprises at least one of solder, silver, tin, solder paste, silver paste, polymer, or combinations thereof.

40. The apparatus of claim 1, further comprising:

one or more connectors configured to electrically couple the die to the package substrate.

* * * * *